United States Patent [19]

Dix

[11] Patent Number: 4,482,665

[45] Date of Patent: Nov. 13, 1984

[54] ENCAPSULATION OF ELECTRONIC COMPONENTS WITH CALCIUM SILICATE-CONTAINING POLY(ARYLENE SULFIDE) COMPOSITIONS

[75] Inventor: James S. Dix, Bartlesville, Okla.

[73] Assignee: Phillips Petroleum Company, Bartlesville, Okla.

[21] Appl. No.: 417,949

[22] Filed: Sep. 14, 1982

[51] Int. Cl.$^3$ ............................ C08K 5/54; C08K 3/34
[52] U.S. Cl. .................................... 524/262; 524/423; 524/451; 524/456; 524/609
[58] Field of Search ............... 524/456, 609, 423, 451, 524/262

[56] References Cited

U.S. PATENT DOCUMENTS

| | | | |
|---|---|---|---|
| 3,725,362 | 4/1973 | Walker | 524/456 |
| 3,846,367 | 11/1974 | Burton | 524/456 |
| 3,929,708 | 12/1975 | Brady et al. | 524/456 |
| 4,176,098 | 11/1979 | Needham | 524/451 |
| 4,337,182 | 6/1982 | Needham | 524/609 |

FOREIGN PATENT DOCUMENTS 2713462  10/1977  Fed. Rep. of Germany ...... 524/456

Primary Examiner—Lewis T. Jacobs

[57] ABSTRACT

Electronic components are encapsulated with a calcium silicate-containing poly(arylene sulfide) composition. The composition can also contain a filler such as talc or silica and an organosilane such as 3-mercaptopropyltrimethoxysilane.

21 Claims, No Drawings

ENCAPSULATION OF ELECTRONIC COMPONENTS WITH CALCIUM SILICATE-CONTAINING POLY(ARYLENE SULFIDE) COMPOSITIONS

This invention relates to the encapsulation of electronic components. This invention also relates to encapsulation compositions.

BACKGROUND

The encapsulation of electronic components represents an art in and of itself. Electronic components are encapsulated to maintain electrical insulation, to provide mechanical protection and to otherwise shield the component from exposure to its environment. As the evolution of electronics continues its rapid advance it becomes increasingly important that the art and technology of encapsulation keep pace. An area of significant concern and interest relates specifically to the compositions used to encapsulate electronic components. There is an on-going effort to discover new and improved encapsulation materials. The present invention represents a contribution to that effort.

A relatively recent development has been the use of poly(arylene sulfide) compositions such as, for example, poly(phenylene sulfide) compositions, as encapsulating materials. These compositions typically represent a carefully balanced blend of at least 3 ingredients: (1) poly(arylene sulfide), (2) glass fibers and (3) filler (such as silica or talc). In addition relatively small amounts of other components such as, for example, colorants, flow improvers, processing aids, organosilanes and the like, can be present.

An example of a composition especially well suited for the encapsulation of active electronic components is presented below:

| | | |
|---|---|---|
| (a) poly(phenylene sulfide) | 35 wt % | |
| (b) glass fibers | 15 wt % | |
| (c) silica | 49 wt % | |
| (d) 3-mercaptopropyltrimethoxysilane | 1 wt % | |

This composition additionally includes colorants, flow improvers and processing aids to suit the particular circumstances.

One very important property of any encapsulation material is electrical resistance. In use, the encapsulation material is generally subjected to a hostile environment that adversely affects the desired properties of the material. Of particular concern are the effects of high temperature conditions and/or of high humidity conditions. Such conditions can cause a decrease in the electrical resistance of the encapsulation material.

It is an objective of those of skill in the art of poly(arylene sulfide) encapsulation compositions to produce compositions which retain high electrical resistance when subjected to hostile conditions such as, for example, high temperature and high humidity. It is also an objective of those of skill in this art to produce poly(arylene sulfide) compositions of increased electrical resistance.

The utility of an encapsulation material is not evaluated solely on the basis of electrical resistance. Electronic components can be damaged when encapsulated with the material. The dislocation or breakage of wires is referred to as wire wash. The dislocation of parts (such as, for example, semiconductor chips) can also be a problem. It is an objective of those of skill in the art to provide encapsulation materials having a reduced tendency to cause wire wash. It is also an objective to provide encapsulation materials exhibiting improved performance in electrical yield tests and in reliability tests.

OBJECTS OF THE INVENTION

It is an object of this invention to provide encapsulation compositions of improved electrical resistance.

It is another object of this invention to provide encapsulation compositions which will give an improved electrical yield.

It is another object of this invention to provide encapsulation compositions having a reduced tendency to cause wire wash.

It is another object of this invention to provide improved encapsulation processes.

It is another object of this invention to provide improved encapsulated electronic components.

These objects and other objects and advantages of this invention will be apparent to a person of skill in the art upon study of this disclosure and of the appended claims.

BRIEF STATEMENT OF THE INVENTION

It has been discovered that the electrical resistance of a poly(arylene sulfide) composition can be improved by employing calcium silicate in the composition. It has also been found that the presence of calcium silicate in the poly(arylene sulfide) composition improves electrical yield and reduces wire wash.

In accordance with this invention an electronic component is encapsulated with a calcium silicate-containing poly(arylene sulfide) composition. The calcium silicate can be, for example, in the form of fibers having an aspect ratio (i.e. length to diameter) of at least about 3 to 1 or more preferably at least about 10 to 1.

DETAILED DESCRIPTION

For the purposes of this disclosure and the appended claims the term poly(arylene sulfide) is intended to designate arylene sulfide polymers. Uncured or partially cured poly(arylene sulfide) polymers whether homopolymer, copolymer, terpolymer, and the like, or a blend of such polymers, can be used in the practice of my invention. The uncured or partially cured polymer is a polymer the molecular weight of which can be increased by either lengthening of a molecular chain or by crosslinking or by combination of both by supplying thereto sufficient energy, such as heat. Suitable poly(arylene sulfide) polymers include, but are not limited to, those described in U.S. Pat. No. 3,354,129, incorporated by reference herein.

Some examples of poly(arylene sulfide) compositions suitable for the purposes of my invention include poly(2,4-tolylene sulfide), poly(4,4'-biphenylene sulfide) and poly(phenylene sulfide). Because of its availability and desirable properties (such as high chemical resistance, nonflammability, and high strength and hardness) poly(phenylene sulfide) is the presently preferred poly(arylene sulfide). Accordingly, poly(phenylene sulfide) compositions are the preferred encapsulation compositions of my invention.

In accordance with the broad concept of my invention electronic components are encapsulated with a poly(arylene sulfide) composition (such as, for example, a poly(phenylene sulfide) composition) containing calcium silicate. The poly(arylene sulfide) composition can be, but is not required to be, a mixture of more than one poly(arylene sulfide). The poly(arylene sulfide) composition can contain, in addition to calcium silicate, other components although the broad concept of my invention is not limited thereto.

My invention also includes more detailed poly(arylene sulfide) compositions which are especially well suited for successful use as encapsulation compositions. These compositions are described later in this disclosure.

The electronic components to be encapsulated in accordance with my invention broadly include all electronic components (i.e. devices, parts, etc.) for which encapsulation is desired. The term electronic component is intended to be broadly construed and includes, by way of non-limiting example, the following:
capacitors,
resistors,
resistor networks,
integrated circuits,
transistors,
diodes,
triodes,
thyristors,
coils,
varistors,
connectors,
condensers,
transducers,
crystal oscillators,
fuses,
rectifiers,
power supplies, and
microswitches.

The definition of each of the above-identified electronic components is similarly intended to be broad and comprehensive. The term integrated circuit, for example, is intended to include, but is not limited to
large scale integrated circuits,
TTL (transistor transistor logic),
hybrid integrated circuits,
linear amplifiers,
operational amplifiers,
instrumentation amplifiers,
isolation amplifiers,
multipliers and dividers,
log/antilog amplifiers,
RMS-to-DC converters,
voltage references,
transducers,
conditioners,
instrumentation,
digital-to-analog converters,
analog-to-digital converters,
voltage/frequency converters,
synchro-digital converters,
sample/track-hold amplifiers,
CMOS switches and multiplexers,
data-acquisition subsystems,
power supplies,
memory integrated circuits,
microprocessors,
and so on.

The calcium silicate to be used in this invention is preferably, but not necessarily, in the form of fibers. Fibers are preferred because in this form their reinforcement utility is optimized. Wollastonite, a naturally occurring calcium metasilicate, is well suited for the purposes of this invention. Wollastonite is a white, acicular mineral that is commercially available. Wollastonite fibers typically have a length to diameter ratio in the range of about 3 to 1 to about 20 to 1. A ratio of at least about 10 to 1 is preferred since this gives improved reinforcement strength to the composition. The average diameter of wollastonite fibers is typically about 3.5 microns.

Although it is my primary purpose to provide, in the form of calcium silicate, a replacement for the glass fibers typically used in poly(arylene sulfide) encapsulation compositions, it should be recognized that the invention does not require the exclusion of glass fibers from the inventive compositions. The use of glass fibers or other reinforcing agents in combination with calcium silicate lies within the scope of the invention. Some examples of other reinforcing agents falling within the scope of this invention include, but are not limited to, glass in any nonfibrous form (e.g. beads, powders, grains, etc.), asbestos fibers and ceramic fibers.

The scope of this invention broadly allows the inclusion of any desired filler. Fillers can be used to improve the dimensional stability, thermal conductivity and mechanical strength of the composition. Some suitable fillers include, for example, talc, silica, clay, alumina, calcium sulfate, calcium carbonate, mica and so on. The fillers can be in the form of, for example, powder, grain or fiber. In selecting a filler the following factors should be considered:
 (1) the electrical conductivity of the filler (the lower the better);
 (2) tendency of the filler to decompose at encapsulation temperatures; and
 (3) the level of ionic impurities in the filler.

Besides reinforcing agents and fillers the compositions of my invention can optionally contain relatively small amounts of other ingredients such as, for example, pigments, flow improvers, and processing aids.

The electrical resistance and hydrolytic stability of the encapsulation compositions of this invention can be improved by the addition of an organosilane to the compositions. Many suitable organosilanes are known in the art. Good results can be obtained with, for example, N-{2-[3-(trimethoxysilyl)propylamino]ethyl}-p-vinylbenzylammonium chloride. Mercaptosilanes can also be used for this purpose. 3-mercaptopropyltrimethoxysilane, $HSCH_2CH_2Si(OCH_3)_3$, is most preferred because of its extraordinary utility in improving electrical resistance and hydrolytic stability.

It should be noted that the first list of electronic components includes both active components (such as, for example, integrated circuits, transistors and diodes) and passive components (such as, for example, capacitors, resistors and resistor networks). The distinction is frequently important and is often determinative of the type of poly(arylene sulfide) encapsulation composition best suited for encapsulation of the component.

These more detailed poly(arylene sulfide) compositions, which are especially well suited for successful use as encapsulation compositions, broadly comprise the following:
 (a) poly(arylene sulfide),
 (b) calcium silicate,
 (c) filler, and
 (d) organosilane. These compositions can optionally contain, in addition to (a), (b), (c) and (d) above, relatively small amounts of other components such as, for example, pigments, flow improvers and processing aids.

COMPOSITIONS FOR THE ENCAPSULATION OF ACTIVE COMPONENTS

Compositions used for the encapsulation of active components can be prepared in accordance with the following weight percentages:

| (a) Poly(arylene sulfide) | | |
|---|---|---|
| about 25 to about | 45 wt % | broad range |
| about 32 to about | 38 wt % | preferred range |
| about | 35 wt % | target |
| (b) Calcium silicate | | |
| about 5 to about | 30 wt % | broad range |
| about 10 to about | 20 wt % | preferred range |
| about | 15 wt % | target |
| (c) Filler | | |
| about 40 to about | 60 wt % | broad range |
| about 45 to about | 55 wt % | preferred range |
| about | 49 wt % | target |
| (d) Organosilane | | |
| up to about | 4 wt % | broad range |
| about .4 to about | 1.5 wt % | preferred range |
| about | 1 wt % | target |

The above weight percentages are based upon the total amount of (a), (b), (c) and (d) in the composition.

The broad ranges represent the ranges within which the composition should be confined in order to obtain satisfactory results. The preferred ranges are preferred because they define a composition possessing the physical, chemical and electrical properties best suited for its intended encapsulation purposes. The target weight percentages represent the presently contemplated best mode.

Although my invention is not limited thereto the viscosity of the composition used for encapsulation of active components should generally not exceed about 800 poise (as tested on a capillary rheometer at 650° F. and at a shear rate of 1000 $(sec)^{-1}$). Encapsulation of active electronic components with compositions having viscosities in excess of about 800 poise can cause damage to the components. It is contemplated that the viscosity of the composition will generally range from about 150 to about 500 poise for active components other than very delicate components such as, for example, integrated circuits with wire leads. With respect to very delicate components such as, for example integrated circuits with wire leads the viscosity of the encapsulation composition should be below about 150 poise (as tested on a capillary rheometer at 650° F. and at a shear rate of 1000 $(sec)^{-1}$). Encapsulation of integrated circuits with compositions any higher in viscosity can cause wire wash (i.e., breaking of the wires of the integrated circuit). It is contemplated that the viscosity of the composition for the encapsulation of such integrated circuits and the like will generally range from about 75 to about 150 poise.

Although viscosity of the composition depends on a number of factors, to obtain composition viscosities below about 800 poise the viscosity of the poly(arylene sulfide) should generally not exceed about 130 poise (as tested on a capillary rheometer at 650° F. and at a shear rate of 1000 $(sec)^{-1}$). It is contemplated that the viscosity of the poly(arylene sulfide) will, in most applications, range up to about 70 poise. To obtain composition viscosities within the desired range for delicate active components such as, for example, integrated circuits with wire leads the viscosity of the poly(arylene sulfide) should generally be less than about 25 poise (as tested on a capillary rheometer at 650° F. and at a shear rate of 1000 $(sec)^{-1}$).

The filler is preferably silica. The silica can be amorphous silica or crystalline silica. Silica is commercially available as a finely ground material having a relatively narrow particle size distribution ranging from about 1 to about 100 micrometers. Such commercial silica is typically made up of about 99.5 weight percent $SiO_2$ with $Al_2O_3$, $Fe_2O_3$, $Na_2O$ and $K_2O$ as the remaining components.

Other fillers include, for example, talc, glass, clay, mica, calcium sulfate and calcium carbonate.

The preferred encapsulation composition for active components is prepared from:
  (a) about 32 to about 38 wt % poly(phenylene sulfide) (viscosity less than about 130 poise as tested on a capillary rheometer at 650° F. and at a shear rate of about 1000 $(sec)^{-1}$),
  (b) about 10 to about 20 wt % calcium silicate fibers,
  (c) about 45 to about 55 wt % silica, and
  (d) about 0.4 to about 1.5 wt % 3-mercaptopropyl-trimethoxysilane.

If the viscosity of the poly(phenylene sulfide) is below about 25 poise (as tested on a capillary rheometer at 650° F. and at a shear rate of 1000 $(sec)^{-1}$) this composition is especially well suited for the encapsulation of integrated circuits with wire leads. Accordingly, integrated circuits encapsulated with this composition, represent one embodiment of my invention.

COMPOSITIONS FOR THE ENCAPSULATION OF PASSIVE COMPONENTS

Compositions used for the encapsulation of passive components can be prepared in accordance with the following weight percentages:

| (a) Poly(arylene sulfide) | | |
|---|---|---|
| about 25 to about | 45 wt % | broad range |
| about 32 to about | 38 wt % | preferred range |
| about | 35 wt % | target |
| (b) Calcium silicate | | |
| about 20 to about | 50 wt % | broad range |
| about 25 to about | 45 wt % | preferred range |
| about | 35 wt % | target |
| (c) Filler | | |
| about 18 to about | 38 wt % | broad range |
| about 23 to about | 33 wt % | preferred range |
| about | 28 wt % | target |
| (d) Organosilane | | |
| up to about | 4 wt % | |
| about .4 to about | 1.5 wt % | preferred range |
| about | 1 wt % | target |

The above weight percentages are based upon the total amount of (a), (b), (c) and (d) in the composition.

The broad ranges represent the ranges within which the composition should be confined in order to obtain good results. The preferred ranges are preferred because they define a composition possessing the physical, chemical and electrical properties best suited for its intended encapsulation purposes. The target weight percentages represent the presently contemplated best mode.

Although my invention is not limited thereto the viscosity of the composition used for encapsulation of passive components should generally not exceed about 1200 poise (as tested on a capillary rheometer at 650° F. and at a shear rate of 1000 (sec)$^{-1}$). Encapsulation of passive electronic components with compositions having viscosities in excess of about 1200 poise can cause damage to the components. It is contemplated that the viscosity of the composition will generally range from about 500 to about 800 poise.

To obtain composition viscosities within the desired ranges the viscosity of the poly(arylene sulfide) should generally not exceed about 300 poise (as tested on a capillary rheometer at 650° F. and at a shear rate of 1000 (sec)$^{-1}$). It is contemplated that the viscosity of the poly(arylene sulfide) will generally range from about 190 to about 300 poise.

The preferred filler is talc because of its availability and ability to improve the dimensional stability, thermal conductivity and mechanical strength of the composition. In place of talc, or in combination with talc, other fillers can be used. Examples of such suitable fillers include, silica, calcium sulfate, calcium carbonate, clay, glass and mica. Calcium sulfate is especially useful in compositions used to encapsulate connectors.

The preferred encapsulation composition for passive components is prepared from:
(a) about 32 to about 38 wt % poly(phenylene sulfide) (viscosity less than about 300 poise as tested on a capillary rheometer at 650° F. and at a shear rate of about 1000 (sec)$^{-1}$),
(b) about 25 to about 45 wt % calcium silicate fibers,
(c) about 23 to about 33 wt % talc, and
(d) about 0.4 to about 1.5 wt % 3-mercaptopropyl-trimethoxysilane.

This composition is especially well suited for the encapsulation of capacitors. Accordingly, capacitors, encapsulated with this composition, represent an embodiment of my invention.

HOW TO MAKE

The compositions of this invention can be made in accordance with any method wherein the poly(arylene sulfide), calcium silicate, filler and organosilane are combined to form a mixture. Many suitable methods are well known to those of skill in the art. By way of example, the components of the composition can be mixed together at room temperature in a rotating drum blender or in an intensive mixer such as a Henschel mixer and then extrusion compounded at a temperature above about the melting point of the poly(arylene sulfide) to produce a uniform blend.

Once made, the composition can be used to encapsulate electronic components in accordance with any encapsulation method suitable for thermoplastic encapsulation compositions. Such methods are well known in the art. The composition can, for example, be introduced into an injection molding apparatus to produce a melt which is extruded into an injection mold wherein the electronic component to be encapsulated is positioned. Transfer molding processes are also acceptable.

The following examples are presented to facilitate disclosure of this invention and should not be interpreted to unduly limit its scope.

EXAMPLE I

An inventive composition and a control composition were prepared from the recipes given in Table IA below. The ingredients were blended in a Henschel intensive mixer. The mixture was introduced into a Buss-Condex extruder and extruded at about 600° F.

TABLE IA

| Compositions | Inventive Composition | | Control Composition | |
|---|---|---|---|---|
| | Parts by Wt. | Weight, % | Parts by Wt. | Weight, % |
| Poly(phenylene sulfide) | 35 | 34.0 | 35 | 34.0 |
| Wollastonite fibers | 15 | 14.6 | — | — |
| Glass fibers | — | — | 15 | 14.6 |
| Fused silica | 50 | 48.6 | 50 | 48.6 |
| Organosilane | 0.8 | 0.78 | 0.8 | 0.78 |
| Flow improver | 1 | 0.97 | 1 | 0.97 |
| N110 carbon black | 1 | 0.97 | 1 | 0.97 |
| Total | 102.8 | 99.92 | 102.8 | 99.92 |

The poly(phenylene sulfide) was characterized by a flow rate of about 3100 g/10 minutes as measured in accordance with ASTM Test Method D 1238, Procedure B, modified to use a 5 kg driving force and a 315° C. melt temperature. The poly(phenylene sulfide) was manufactured by Phillips Chemical Company.

The wollastonite fibers were a naturally occurring calcium metasilicate, CaSiO$_3$ marketed by the NYCO Division of Processed Minerals Inc. of Willsboro, N.Y., under the trademark NYAD® G. The wollastonite fibers had an aspect ratio (i.e. length to diameter) of about 20:1. The wollastonite contained minor amounts (not more than a total of 3 percent) of other oxides such as Fe$_2$O$_3$, Al$_2$O$_3$, MnO, MgO and TiO$_2$ and of water.

The glass fibers were Owens-Corning type 497 glass fibers (about 50 to 55×10$^{-5}$ inches in diameter) chopped into about ⅛ inch lengths.

The fused silica was a finely ground material having a 99% particle size finer than 40 micrometers.

The organosilane was a 40 wt % methyl alcohol solution of N-{2-[3-(trimethoxysilyl)propylamino]ethyl}p-vinylbenzylammonium chloride sold under trademark Z-6032 by the Dow Corning Corporation.

The flow improver was N,N'-ethylene bis(stearamide). The N110 carbon black, sold by Phillips Chemical Co., was used as a colorant.

Electrical insulation resistance was tested in accordance with the general method of ASTM Test Method D 257 using a conditioning period of 48 hours in a 95±1% relative humidity chamber at 90° C. The ASTM recommended practice E104 for controlling humidity was followed. Resistance was measured by employing a 500 volt potential and a Gen Rad Megohmeter (type 1862-C) having the capability to measure resistance up to 2×10$^{12}$ ohm. The results are shown in Table IB below:

TABLE IB

| Test Results | | |
|---|---|---|
| | Invention | Control |
| Electrical Resistance, ohms | >2 × 10$^{12}$ | 1.8 × 10$^{12}$ |

The data given in Table IB show that the wollastonite-containing composition surpassed the control in terms of insulation resistance. Note that the insulation resistance corresponding to the wollastonite-containing composition is reported as greater than 2×10$^{12}$. The actual value could not be determined because the Gen Rad Megohmeter's measuring capability did not exceed 2×10$^{12}$ ohm. It is concluded that the presence of calcium silicate can improve the electrical resistance of a poly(arylene sulfide) encapsulation composition.

EXAMPLE II

Injection molding was employed to encapsulate "dummy" integrated circuit lead frames with the compositions of Example I. The frames were "dummies" because of the absence of semiconductor chips. Two types of dummy frames, arbitrarily designated type I and type II, were used. Type I consisted of 10 chip mounting pads with 14 wire leads connected to each pad. Type II consisted of 10 chip mounting pads with 5 wire leads attached to each of two sides of each pad (for a total of 10 wire leads per pad). The wire leads of the type II frame had a slightly longer wire span than the wire leads of the type I frame. All of the wires were gold wires having a diameter of 1 mil.

The control composition was used to encapsulate both a type I frame and a type II frame. Similarly, the inventive composition was used to encapsulate both a type I frame and a type II frame.

The average melt temperature during injection molding was about 350° C. The mold temperature averaged about 150° C. The injection pressure was about 12.4 to 15.5 MPa. The cycle time was about 30 seconds.

Each frame was cooled and ejected from its mold. Each frame was then inspected by X-ray analysis to determine if any displacement or loss of the wires had occurred. Such loss or displacement of wires is referred to as wire wash. The inspection revealed the results presented in Table II below.

TABLE II

| | Test Results | |
|---|---|---|
| | Number of Broken Wires/Total Wires | |
| Composition | Type I | Type II |
| Control | 135/140 | 100/100 |
| Invention | 89/140 | 77/100 |

The results indicate that the wollastonite-containing composition (invention) was less subject to wire wash than the glass-containing composition (control).

EXAMPLE III

Four compositions were prepared as before in accordance with the recipes set forth in Table IIIA below.

TABLE IIIA

| | Compositions (Given in Parts by Weight) | | | |
|---|---|---|---|---|
| | Control | Invention | | |
| | (1) | (2) | (3) | (4) |
| Poly(phenylene sulfide) | 35 | 35 | 35 | 35 |
| Wollastonite fibers | | | | |
| untreated | 0 | 0 | 0 | 15 |
| organosilane pretreated | 0 | 15 | 15 | 0 |
| Glass fibers | 15 | 0 | 0 | 0 |
| Fused silica | 50 | 50 | 50 | 50 |
| Organosilane | 0.8 | 0.8 | 0.8 | 0.8 |
| First flow improver | 1 | 1 | 1 | 1 |
| Second flow improver | 0 | 2 | 0 | 0 |
| Fe₂O₃ | 2 | 2 | 2 | 2 |
| N110 carbon black | 0.2 | 0.2 | 0.2 | 0.2 |
| TOTAL | 104.0 | 106.0 | 104.0 | 104.0 |

The poly(phenylene sulfide) was characterized by a flow rate of about 2700 g/10 minutes as measured in accordance with ASTM Test Method D 1238, Procedure B, modified to use a 5 kg driving force and a 315° C. melt temperature. The poly(phenylene sulfide) was manufactured by Phillips Petroleum Company of Bartlesville, Okla.

The carbon black, first flow improver, organosilane, fused silica, glass fibers and wollastonite fibers were all as described in Example I. Note, however, that the wollastonite fibers of compositions 2 and 3 were pretreated on their surfaces with 0.5 weight percent organosilane. The organosilane used for pretreatment was the same type of organosilane added to each of the compositions.

The second flow improver was particulate polyethylene (density of 0.962 g/cc and nominal melt index of about 30 g/10 min.). Particulate red iron oxide was added as a second colorant.

Each composition was tested for both flow rate and wire wash. The flow rate was measured in accordance with ASTM Test Method D 1238, Procedure B, modified to use a 5 kg driving force and a 315° C. melt temperature. Wire wash was determined as in Example II. The results are reported in Table IIIB below.

TABLE IIIB

| | Test Results | | |
|---|---|---|---|
| | Flow Rate | % of Broken Wires | |
| Composition | (g/10 min) | Type I | Type II |
| 1 | 88 | 80% | 92% |
| 2 | 121 | 27% | 52% |
| 3 | 132 | 20% | (not tested) |
| 4 | 130 | 15% | 47% |

The results indicate that all of the wollastonite-containing compositions had higher flow rates and significantly less wire wash than the glass-containing composition (control).

EXAMPLE IV

Three compositions were prepared by melt compounding the ingredients in accordance with the recipes set forth in Table IVA below.

TABLE IVA

| | Compositions (Given in Parts by Weight) | | |
|---|---|---|---|
| | Control | Invention | |
| | (1) | (2) | (3) |
| Poly(phenylene sulfide) | 36 | 36 | 36.6 |
| Wollastonite fibers | — | 14.8 | 14.6 |
| Glass fibers | 14.8 | — | — |
| Fused silica | 49.2 | 49.2 | 48.7 |
| Organosilane | 0.4 | 0.4 | 0.4 |
| Flow improver | 1.0 | 1.0 | — |
| TOTALS | 101.4 | 101.4 | 100.3 |

The poly(phenylene sulfide) used in compositions 1 and 2 had an extrusion rate of about 52 g/10 minutes. The poly(phenylene sulfide) of composition 3 was characterized by an extrusion rate of about 110 g/10 minutes. These extrusion rates were measured in accordance with ASTM Test Method D 1238, Procedure B, modified to use a 345 g driving force, a 315° C. melt temperature and an orifice of 0.0825 inches in diameter and 1.250 inches in length.

The fused silica and the flow improver were as described in Example I.

The wollastonite fibers were as described in Example I except that their surfaces were pretreated with 0.5 weight percent gamma-glycidoxypropyltrimethoxysilane.

The glass fibers were PPG type 3080 glass fibers of about ⅛ inch in length and 55 to 65×10$^{-5}$ inches in diameter.

The organosilane incorporated into the composition was 3-mercaptopropyltrimethoxysilane.

Each of the compositions was tested to determine extrusion rate, viscosity and electrical yield. The extrusion rate was measured in accordance with the above-described extrusion rate measuring method except that a 1270 g driving force was used instead of a 345 g driving force. Viscosity was measured at 343° C. and 10$^2$ sec$^{-1}$ shear rate on a Sieglaff-McKelvey capillary rheometer.

Electrical yield was obtained as follows. Each of the compositions was used to encapsulate (by injection molding as in the previous examples) wire-bonded TTL integrated circuit devices. Electrical yield represents the percentage of encapsulated integrated circuits found to be operable when electrically tested for continuity and functionality. The results are presented in Table IVB below.

TABLE IVB

| Composition | Test Results | | Electrical Yield | |
|---|---|---|---|---|
| | Extrusion Rate (g/10 min) | Viscosity (poise) | Operable/total | % |
| 1 | 37 | 288 | 54/60 | 90% |
| 2 | 42 | 277 | 73/78 | 94% |
| 3 | 40 | 289 | 28/28 | 100% |

The data indicate the marked superiority of the wollastonite-containing compositions in terms of electrical yield. An improvement (i.e. increase) in extrusion rate is also noted for the wollastonite-containing compositions.

I claim:

1. An article of manufacture comprising an electronic component encapsulated with a composition; wherein said composition comprises:
   (i) about 25 to about 45 weight percent poly(arylene sulfide),
   (ii) about 5 to about 30 weight percent calcium silicate,
   (iii) about 40 to about 60 weight percent filler, and
   (iv) about 0 to about 4 weight percent organosilane; wherein said weight percentages are based upon total amount of (i), (ii), (iii) and (iv).

2. An article of manufacture as recited in claim 1 wherein said poly(arylene sulfide) is poly(phenylene sulfide); wherein said calcium silicate is in the form of fibers having a ratio of length to diameter of at least about 3 to 1; wherein said filler is silica; and wherein said organosilane is 3-mercaptopropyltrimethoxysilane.

3. An article of manufacture as recited in claim 1 wherein the viscosity of said composition as tested on a capillary rheometer at 650° F. and at a shear rate of 1000 (sec)$^{-1}$, is less than about 1200 poise.

4. An article of manufacture comprising an electronic component encapsulated with a composition; wherein said composition comprises:
   (i) about 25 to about 45 weight percent poly(arylene sulfide),
   (ii) about 20 to about 50 weight percent calcium silicate,
   (iii) about 18 to about 38 weight percent filler, and
   (iv) about 0 to about 4 weight percent organosilane; wherein said weight percentages are based upon total amount of (i), (ii), (iii) and (iv).

5. An article of manufacture as recited in claim 4 wherein said poly(arylene sulfide) is poly(phenylene sulfide); wherein said calcium silicate is in the form of fibers having a ratio of length to diameter of at least about 3 to 1; wherein said filler is silica; and wherein said organosilane is 3-mercaptopropyltrimethoxysilane.

6. An article of manufacture as recited in claim 4 wherein the viscosity of said composition as tested on a capillary rheometer at 650° F. and at a shear rate of 1000 (sec)$^{-1}$, is less than about 1200 poise.

7. An article of manufacture as recited in claim 1 wherein said calcium silicate is provided in the form of wollastonite.

8. An article of manufacture as recited in claim 4 wherein said calcium silicate is provided in the form of wollastonite.

9. A composition for encapsulating an active electronic component comprising:
   (i) about 25 to about 45 weight percent poly(arylene sulfide),
   (ii) about 5 to about 30 weight percent calcium silicate,
   (iii) about 40 to about 60 weight percent filler, and
   (iv) about 0 to about 4 weight percent organosilane; wherein said weight percentages are based upon total amount of (i), (ii), (iii) and (iv).

10. A composition in accordance with claim 9 wherein said poly(arylene sulfide) is poly(phenylene sulfide); wherein said calcium silicate is in the form of fibers having a ratio of length to diameter of at least about 3 to 1; wherein said filler is silica; and wherein said organosilane is 3-mercaptopropyltrimethoxysilane.

11. A composition for encapsulating a passive electronic component comprising:
   (i) about 25 to about 45 weight percent poly(arylene sulfide),
   (ii) about 20 to about 50 weight percent calcium silicate,
   (iii) about 18 to about 38 weight percent filler, and
   (iv) about 0 to about 4 weight percent organosilane; wherein
said weight percentages are based upon total amount of (i), (ii), (iii) and (iv).

12. A composition in accordance with claim 11 wherein said poly(arylene sulfide) is poly(phenylene sulfide); wherein said calcium silicate is in the form of fibers having a ratio of length to diameter of at least about 3 to 1; wherein said filler is selected from the group consisting of:
   talc
   silica, and
   calcium sulfate; and
wherein said organosilane is 3-mercaptopropyltrimethoxysilane.

13. A composition in accordance with claim 12 wherein the viscosity of said composition ranges from about 500 to about 800 poise as tested on a capillary rheometer at 650° F. and at a shear rate of 1000 (sec)$^{-1}$.

14. An electronic component encapsulated with the composition of claim 9.

15. An electronic component encapsulated with the composition of claim 10.

16. An electronic component encapsulated with the composition of claim 11.

17. An electronic component encapsulated with the composition of claim 12.

18. In a process for encapsulating an electronic component with a poly(arylene sulfide) composition, the improvement which comprises employing as said poly-(arylene sulfide) composition a composition comprising:
(i) about 25 to about 45 weight percent poly(arylene sulfide),
(ii) about 5 to about 30 weight percent calcium silicate,
(iii) about 40 to about 60 weight percent filler, and
(iv) about 0 to about 4 weight percent organosilane;
wherein said weight percentages are based upon total amount of (i), (ii), (iii) and (iv).

19. A process as recited in claim 18 wherein said poly(arylene sulfide) is poly(phenylene sulfide); wherein said calcium silicate is in the form of fibers; wherein said filler is silica or talc; wherein said organosilane is a mercaptosilane; and wherein injection molding is used to encapsulate said electronic component.

20. In a process for encapsulating an electronic component with a poly(arylene sulfide) composition, the improvement which comprises employing as said poly-(arylene sulfide) composition a composition comprising:
(i) about 25 to about 45 weight percent poly(arylene sulfide),
(ii) about 20 to about 50 weight percent calcium silicate,
(iii) about 18 to about 38 weight percent filler, and
(iv) about 0 to about 4 weight percent organosilane;
wherein said weight percentages are based upon total amount of (i), (ii), (iii) and (iv).

21. A method as recited in claim 20 wherein said poly(arylene sulfide) is poly(phenylene sulfide); wherein said calcium silicate is in the form of fibers; wherein said filler is silica or talc; wherein said organosilane is a mercaptosilane; and wherein injection molding is used to encapsulate said electronic component.

* * * * *